United States Patent [19]

Shigeta et al.

[11] Patent Number: 4,923,533
[45] Date of Patent: May 8, 1990

[54] MAGNETIC SHIELD-FORMING MAGNETICALLY SOFT POWDER, COMPOSITION THEREOF, AND PROCESS OF MAKING

[75] Inventors: Masao Shigeta, Narashino; Tsutomu Choh, Yachiyo; Hiroyoshi Shimizu, Narita; Ippo Hirai, Yachiyo; Shohei Mimura, Tokyo; Atsushi Makimura, Sagamihara; Hiroshi Hosaka, Hoya, all of Japan

[73] Assignees: TDK Corporation; Tokyo Magnetic Printing Company, Ltd., both of Tokyo, Japan

[21] Appl. No.: 225,836

[22] Filed: Jul. 29, 1988

[30] Foreign Application Priority Data

| Jul. 31, 1987 | [JP] | Japan | 62-190261 |
| Aug. 29, 1987 | [JP] | Japan | 62-215857 |
| Oct. 16, 1987 | [JP] | Japan | 62-262211 |
| Dec. 25, 1987 | [JP] | Japan | 62-326894 |
| Dec. 26, 1987 | [JP] | Japan | 62-331224 |
| Dec. 28, 1987 | [JP] | Japan | 62-333666 |
| Dec. 29, 1987 | [JP] | Japan | 62-332526 |
| Jul. 21, 1988 | [JP] | Japan | 63-182490 |

[51] Int. Cl.$^5$ ............................................. H01F 1/04
[52] U.S. Cl. .................................... 148/304; 75/252; 75/254; 428/568
[58] Field of Search ............... 148/304, 305; 428/546, 428/568; 75/251, 252, 254

[56] References Cited

U.S. PATENT DOCUMENTS

| 4,720,411 | 1/1988 | Shimozawa et al. | 428/141 |
| 4,726,990 | 2/1988 | Shimozawa et al. | 428/323 |
| 4,773,931 | 9/1988 | Mishima et al. | 75/251 |

FOREIGN PATENT DOCUMENTS

| 0239031 | 9/1987 | European Pat. Off. |
| 59268 | 4/1983 | Japan |
| 197205 | 11/1983 | Japan |
| 201493 | 11/1984 | Japan |
| 401 | 1/1985 | Japan |
| 14081 | 4/1985 | Japan |

OTHER PUBLICATIONS

Bulletin of the Japan Institute of Metal, vol. 24, No. 6, 1985, pp. 509–511.

Primary Examiner—Upendra Roy
Assistant Examiner—George Wyszomierski
Attorney, Agent, or Firm—Oblon, Spivak, McClelland, Maier & Neustadt

[57] ABSTRACT

A powder comprising flakes of magnetically soft amorphous alloy having an average thickness of 0.01–1 μm and an aspect ratio of 10–10,000 is blended with a binder to form a coating composition from which a magnetic shield is fabricated. The alloy is basically an Fe-B-Si ternary alloy in which iron may be partially replaced by another metal.

35 Claims, 1 Drawing Sheet

MAGNETIC SHIELD-FORMING MAGNETICALLY SOFT POWDER, COMPOSITION THEREOF, AND PROCESS OF MAKING

BACKGROUND OF THE INVENTION

1. Field of the Invention

This invention relates to magnetically soft alloy powder suitable for forming magnetic shields, a magnetic shielding composition containing the same, and a process of making the same.

2. Prior Art

Magnetic shields are used to prevent magnetized objects or magnetic field-producing sources from affecting other objects, electric circuits or the like. Because of their high magnetic permeability, metal plates are usually good magnetic shields. However, the metal plates have a limited range of applications. Metal powder is more convenient because magnetic shields of any desired shape can be formed therefrom at any desired location. Powder may be dispersed in an organic binder to form a coating composition which may be applied to a site to be shielded or coated onto a suitable flexible substrate to form a magnetic shield.

A variety of magnetic shielding compositions have been proposed which contain high magnetic permeability metal powder. For example, Japanese Patent Application Kokai No. 58-59268 discloses a magnetic shielding coating composition comprising flat particles of high magnetic permeability alloy and a polymeric binder. Japanese Patent Application Kokai No. 59-201493 discloses a magnetic shielding coating composition comprising flat particles of magnetically soft amorphous alloy and a polymeric binder. These compositions comprising flat particles show isotropic magnetic shielding characteristics between planes perpendicular to a thickness direction when applied as a film.

The flat particles of magnetically soft amorphous alloy disclosed in Japanese Patent Application Kokai No. 59-201493 are produced by melting a transition metal-metalloid alloy at a high temperature, contacting the melt to the surface of a chill roll to rapidly quench the alloy, and crushing the resulting ribbon. In general, there are available ribbons having a thickness of about 10 to about 50 $\mu$m because the process imposes a lower limit of 10 $\mu$m upon the ribbon thickness. Such ribbons are crushed into a scaly powder, in which the thickness of scales remains unchanged. The scaly powder is then blended with a binder to form a coating which has poor magnetic shielding properties. Although amorphous alloy itself has very good magnetic properties, scaly powder thereof cannot take full advantage of its own nature.

One method for preparing scales by rapidly quenching alloy and crushing is disclosed in Japanese Patent Application Kokai No. 58-197205. Crushing is carried out by conventional well-known means such as stamp mills, dry ball mills, wet ball mills, attritors, and vibratory mills. Japanese Patent Application Kokai No. 60-401 discloses the preparation of scales by rapidly quenching amorphous alloy in sheet, ribbon, tape or wire form, rendering the ribbon alloy brittle at a temperature lower than its glass transition temperature, and crushing the ribbon. Also the alloy is crushed by such means as rod mills, ball mills, impact mills, disk mills, stamp mills, and crusher rolls. These crushing means fail to comminute the given material to a size smaller than the minimum thickness of sheet or ribbon. There are produced isotropic scales. This is because the conventional crushing techniques have little possibility of cleaving alloy grains or rolling them into thinner ones. A coating composition containing such scales of a relatively large size is difficult to form an even coating. A magnetic shield formed therefrom tends to be uneven in magnetic shielding performance, allowing local leakage of a magnetic field.

Among magnetic fields to be shielded, some are isotropic, but many are more intense in a particular direction. In the latter case, it is desired to design the shield so as to achieve an intense magnetic shielding effect in the particular direction. A shield prepared from conventional scaly powder is little effective even when scales are magnetically oriented during coating.

When amorphous alloy was milled in a vibratory ball mill, which is one of the mills most widely used with amorphous alloys, to determine the relationship of average outer diameter (D50 to be defined later) of particles to the milling time, it was found that the average outer diameter D50 decreases with time. The average outer diameter eventually reaches to the range of about 1 to about 30 $\mu$m, although the actual value varies somewhat with milling parameters, and milling is promoted no longer. The particles produced by milling are initially flat in shape and gradually becomes granular or round with the lapse of milling time. It was observed that milling includes two stages. In the first stage of milling, amorphous ribbons are crushed into relatively flat shreds having an average outer diameter of about 50 $\mu$m to several mm and a thickness of about 10 to about 50 $\mu$m while little crushing takes place in a thickness direction of the ribbon. In the second stage of milling, relatively flat shreds are further crushed into uneven irregular granular particulates. The powder known as comprising flat shreds is a powder obtained from the first stage of milling. The powders described in the above-cited publications also belong to this class. It is difficult to prepare a coating composition from such flat shreds which is as thick as 10 to 50 $\mu$m. On the other hand, granular particles obtained in the second stage, particularly fine particles having a diameter of several $\mu$m are suitable to form a coating composition, but have poor magnetic shielding properties because of isotropy.

Another important problem associated with magnetic shields is corrosion resistance. Conventional shields of metal or alloy often rust when used at elevated temperatures and high humidity. There is a need for a corrosion resistant magnetic shield.

SUMMARY OF THE INVENTION

A primary object of the present invention is to provide an improved magnetically soft alloy powder suitable for forming a magnetic shield.

Another object of the present invention is to provide a powder of magnetically soft alloy flakes suitable for forming a magnetic shield.

A further object of the present invention is to provide a composition having improved magnetic shielding properties.

A still further object of the present invention is to provide a magnetic shielding composition having magnetically soft alloy flakes dispersed uniformly therein.

A yet further object of the present invention is to provide a magnetic shield formed from magnetically soft alloy powder.

A further object of the present invention is to provide a magnetic shield showing directional magnetic shielding performance.

A further object of the present invention is to provide a process for manufacturing such magnetically soft alloy flake powder.

According to a first aspect of the present invention, there is provided a powder suitable for forming a magnetic shield, comprising flakes of magnetically soft amorphous alloy having an average thickness of from about 0.01 to about 1 μm and an aspect ratio of from about 10 to about 10,000. The aspect ratio is defined as average outer diameter divided by average thickness.

According to a second aspect of the present invention, there is provided a magnetic shielding composition comprising a magnetically soft amorphous alloy flake powder as defined above and a binder.

Preferably, the ratio of major to minor axes is at least about 1.2, provided that each flake gives a contour having major and minor axes in a projected plane.

Preferably, the alloy has a basically ternary composition predominantly comprising iron Fe, silicon Si, and boron B and represented by the formula:

$$Fe_u M_v (Si,B)_w$$

wherein

M is at least one substituting metal selected from the group consisting of Cr, Nb, Ti, V, Ta, Mo, W, Mn, Co, and Ni, u, v, and w are atom percents of Fe, M, and Si+B, respectively, v is a positive number (inclusive of 0) of from 0 to 10, w is a positive number of from 15 to 38, and u is a positive number of $(100-v-w)$.

According to a third aspect of the present invention, there is provided a process for producing a powder of magnetically soft amorphous alloy flakes suitable for forming a magnetic shield, the process comprising crushing the alloy into pieces, and milling the alloy pieces into flakes until the flakes have an average thickness of from about 0.01 to about 1 μm and an aspect ratio of from about 10 to about 10,000.

BRIEF DESCRIPTION OF THE DRAWING

The above and other objects, features, and advantages of the present invention will be better understood from the following description taken in conjunction with the accompanying drawing, in which.

the only figure.

DETAILED DESCRIPTION OF THE INVENTION

Shape factors

Figure 1:
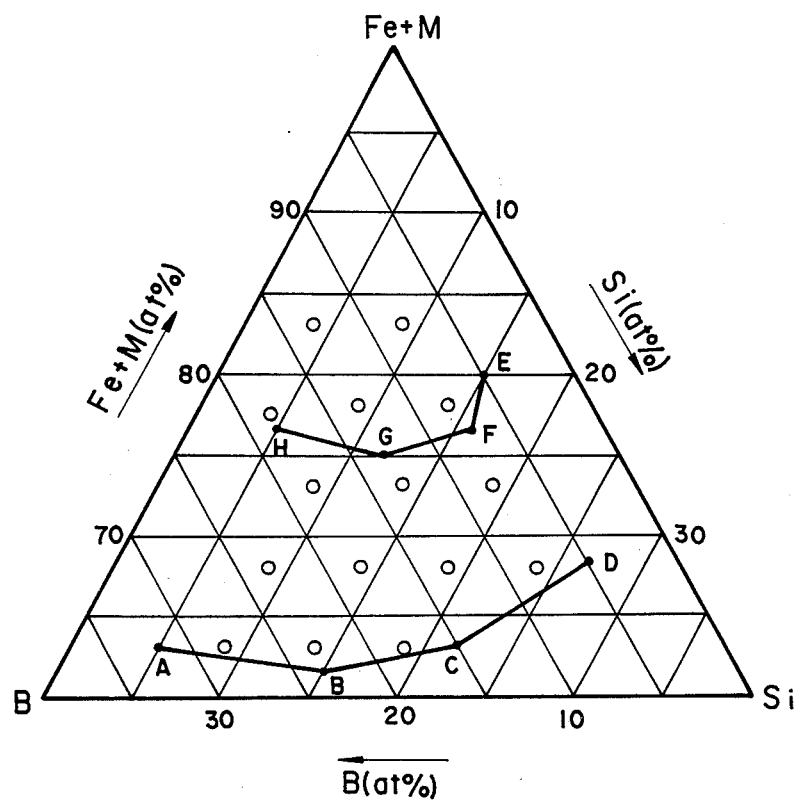
FIG. 1 is a diagram showing the composition of (Fe+M)-B-Si ternary alloy.

The particles of magnetically soft amorphous alloy used in the practice of the present invention are generally of flat shape and have an average thickness of from about 0.01 to about 1 μm. Flat particles are also referred to as flakes. Flakes having an average thickness of less than 0.01 μm are not only difficult to disperse in a binder to form a magnetic shielding composition, but have poor magnetic properties including magnetic permeability, showing undesired shielding performance. Flakes having an average thickness of more than 1 μm are disadvantageous particularly when a thin magnetic shielding coating is formed therefrom. It is difficult to form a coating having such large flakes evenly dispersed. Since the coating can contain a fewer number of large flakes in a thickness direction, the coating exhibits insufficient shielding performance. Better results are obtained when the average thickness ranges from about 0.01 μm to about 0.6 μm, most preferably from about 0.01 μm to about 0.5 μm. It is to be noted that the average thickness of particles may be measured using a scanning electron microscope for analysis.

It is to be understood that flakes or flat particles designate those particles of approximately hexagonal or parallelepiped shape in which at least one dimension is relatively larger than the thickness dimension whereas granular particles designate those particles of approximately spherical shape in which three dimensions are approximately equal.

The magnetically soft amorphous alloy flakes have an average aspect ratio of from about 10 to about 10,000. The aspect ratio is defined as a ratio of average outer diameter to average thickness. With an average aspect ratio of less than 10, flat particles are largely affected by a demagnetizing field, losing effective magnetic properties such as magnetic permeability and hence, shielding performance. Particles with an average aspect ration of more than 10,000 must have a large average outer diameter, and a coating composition containing such elongated flakes is difficult to mold. Better results are obtained when the average aspect ratio ranges from about 10 to about 1000, most preferably from about 30 to about 500.

The average outer diameter used herein is known as D50 and is obtained by measuring the size of particles by a particle size distribution meter or granulometer, accumulating the weights of particles from those having smaller size, and determining the particle size when the accumulated weight reaches 50% of the total weight.

Flat particles are considered as each having a certain contour in a projected plane or major plane. The particle has a major axis or maximum diameter a and a minor axis or minimum diameter b in the major plane contour. Preferably, the average ratio of major to minor axes, a/b, is at least about 1.2 particularly when directional magnetic shielding is necessary. When a source produces a directional magnetic field to be shielded, a magnetic shielding coating having improved magnetic permeability and hence, improved magnetic shielding effect in the same direction can be formed by curing a magnetic coating composition under an orientating magnetic field applied in the same direction. Better results are obtained when a/b ranges from about 1.2 to about 5. The major and minor axes of particles may be determined using a transmission electron microscope for analysis.

Preferably the magnetically soft amorphous alloy powder of the present invention has such a particle size distribution profile that the powder contains (A) at least 35% by weight of magnetically soft amorphous alloy flakes having a particle size of from 10 to 50 μm, (B) up to 0.5% by weight of magnetically soft amorphous alloy flakes having a particle size of more than 88 μm, and (C) up to 10% by weight of magnetically soft amorphous alloy flakes having a particle size of less than 3 μm, based on the total weight of magnetically soft amorphous alloy powder. The particle size used herein is an average particle size as measured by a granulometer using a light scattering method. More particularly, the distribution of particle size is determined by means of a granulometer based on a light scattering method, by exposing a circulating flow of a sample to a laser beam or radiation from a light source such as a halogen lamp, and measuring the angle of Fraunhofer diffraction of Mie scattering. For detail, reference is made to "Funtai To Kogyo" (Powder & Industry), vol. 19, No. 7 (1987).

When magnetically soft amorphous alloy flakes having a particle size of from 10 to 50 μm occupy at least 35% by weight of the total weight of the magnetically soft amorphous alloy powder as measured by the particle size distribution measurement described above, the powder can be readily dispersed in a binder to form a magnetic shielding composition. The composition thus exhibits satisfactory magnetic shielding performance because it is free of a local loss of magnetic shielding performance or magnetic permeability. Better results are obtained when magnetically soft amorphous alloy particles having a particle size of from 10 to 50 μm occupy at least 40% by weight, especially at least 50% by weight of the total weight of the magnetically soft amorphous alloy powder. The upper limit of the content of particles having a particle size of from 10 to 50 μm is generally 90% by weight.

When magnetically soft amorphous alloy particles having a particle size of more than 88 μm occupy more than 0.5% by weight of the total weight of magnetically soft amorphous alloy powder, a composition of the powder with a binder would tend to be rather inconsistent to mold, incurring a local variation of magnetic shielding performance. Better results are obtained when magnetically soft amorphous alloy particles having a particle size of more than 88 μm occupy 0 to 0.3% by weight of the total weight of the magnetically soft amorphous alloy powder.

When magnetically soft amorphous alloy particles having a particle size of less than 3 μm occupy more than 10% by weight of the total weight of magnetically soft amorphous alloy, a composition of the powder with a binder would tend to have a low magnetic permeability or unsatisfactory magnetic shielding performance. Better results are obtained when magnetically soft amorphous alloy particles having a particle size of less than 3 μm occupy 0 to 7% by weight of the total weight of the magnetically soft amorphous alloy powder.

Insofar as the powder has the above-mentioned particle size distribution, other particle size distribution profiles are not critical.

Alloy composition

The magnetically soft amorphous alloy particles as defined above may be obtained by rapidly quenching a melt of the alloy into a ribbon, flake, sheet or similar form, and finely dividing the alloy. Use may also be made of amorphous alloy powder prepared by water atomizing.

The amorphous alloy used herein may have any desired alloy composition including a composition consisting essentially of a ferromagnetic transition metal, a metalloid, and a minor amount of an optional element. The ferromagnetic transition metal may be iron (Fe), cobalt (Co) or nickel (Ni), and especially predominantly comprise iron. The metalloid may be boron (B), silicon (Si), carbon (C), phosphorus (P) or germanium (Ge), and especially predominantly comprise boron and silicon. The most preferred alloy composition is basically a Fe-B-Si ternary system. The alloy composition of Fe-B-Si ternary system may further contain up to 10 atom % of an element selected from the group consisting of Cr, Nb, Mn, Mo, Al, Ti, V, Sn, Zn, Cu, and mixtures thereof.

Fe-B-Si alloys form magnetically soft amorphous alloys when they have compositions given at symbols "o" in the ternary diagram of FIG. 1. Broadly stated, alloys having a Fe-B-Si composition falling within a region encompassing these points of "o" may be used. FIG. 1 is a ternary diagram of (Fe+M)-Si-B composition where M is as defined later.

Preferably the alloy has a composition of the following formula:

$$Fe_u M_v (Si,B)_w$$

wherein

M is at least one substituting metal selected from the group consisting of Cr, Nb, Ti, V, Ta, Mo, W, Mn, Co, and Ni, u, v, and w represent atom percents of Fe, M, and Si +B, respectively, and v = 0 to 10, preferably 2 to 8, w = 15 to 38, preferably 18 to 30, and u = 100 − v − w.

Letter v is a positive number of more than 0 when M is present. Substituting metal M is added to the ternary alloy for improving the corrosion resistance and brittleness thereof. The content (v) of substituting metal (s) M is preferably limited to 10 atom % of the alloy because an alloy containing more than 10 atom % (in total) of substituting metal (s) is reduced in saturated magnetic flux density.

In view of corrosion resistance, M is preferably chromium (Cr) or a mixture of chromium (Cr) and at least one metal selected from the remaining metals. Preferably Cr is added to the alloy as one or sole metal M, more preferably in an amount of 2 to 10 atom %. Also preferably, 2 to 9 atom % of Cr and 1 to 8 atom % of Nb are added provided that the total amount is up to 10 atom %. When at least one metal of Nb, Mo, W, Ta, V, Ti, Co and Ni, especially at least one metal of Nb, Mo and Ni is added to the alloy, the content thereof is preferably controlled to 1 to 10 atom %. Inclusion of these additional metals in such a content will improve corrosion resistance and brittleness without lowering saturated magnetic flux density. The total content of a mixture of these substituting metals is up to 10 atom % as described above.

The content (w) of silicon and boron ranges from 15 to 38 atom % as described above. This range of w ensures that the composition forms an amorphous alloy.

Carrying out an experiment on a wide variety of ternary alloy and substituted ternary alloy compositions, we have found that amorphous alloys are brittle and readily crushable when they have a composition falling within a polygon ABCDEFGH which is delimited by connecting in order points A through H in the ternary composition diagram of FIG. 1 where a coordinate point is represented by atom percents of Fe+M, B and Si.

More particularly, the preferred range is the polygon ABCDEFGH which is delimited by connecting the following points in order:

A (63, 32, 5),
B (62, 23, 15),
C (63, 15, 22),
D (68, 5, 27),
E (80, 5, 15),
F (77, 7, 16),
G (75, 13, 12), and
H (77, 18, 5)

in the ternary composition diagram of FIG. 1 where a coordinate point (Fe+M, B, Si) is represented by a set of atom percents of Fe+M, B and Si. It has been empirically found that no change is necessary in the ternary diagram of FIG. 1 for both cases where the metal component is solely iron and a mixture of iron and substituting metal (s) M. An alloy having a composition within this range not only exhibits satisfactory magnetic shielding properties, but is also sufficiently brittle. Brittleness may be evaluated by forming an amorphous ribbon of a predetermined thickness, bending the ribbon around a series of rods having a varying diameter d, and determining the diameter d at which the ribbon is broken. Alloys having compositions approaching segments E-F-G-H from below have a d value of approximately 0 mm and alloys having compositions approaching segments A-B-C-D from above have a d value of approximately 5 mm.

In the broad range defined by the above formula, the zone above the line connecting points E, F, G and H in order in FIG. 1 is a zone where mechanically tough amorphous alloys are formed by rapid quenching. The tough alloy must be rendered brittle by heating to such an elevated temperature as not to adversely affect magnetic properties before it is subject to crushing and milling. Such tough alloys are less desirable in that they add to the expense of crushing in the application requiring crushing as in the present invention.

In one preferred embodiment of the Fe-B-Si alloy, Fe is partially replaced by chromium, niobium and an optional third substituting metal as described above. Then the metal component X of the ternary alloy system may be represented by the formula:

$$X = Fe_u + Cr_x + Nb_y + M'_z$$

wherein
M' is a third substituting metal selected from the group consisting of Ti, V, W, Ta, Mo, Mn, Co and Ni,
x = 2 to 10,
y = 0 to 8, preferably 1 to 8,
z = 0 to 8,
x+y+z = 2 to 10, preferably 3 to 10.
Then the entire alloy has a composition of the formula:

$$Fe_u Cr_x Nb_y M'_z (Si,B)_w$$

wherein
M' is a third substituting metal selected from the group consisting of Ti, V, W, Ta, Mo, Mn, Co, and Ni,
x = 2 to 10,
y = 0 to 8, preferably 1 to 8,
z = 0 to 8,
x+y+z = 2 to 10, preferably 3 to 10,
w = 15 to 38, more preferably 18 to 30, most preferably 20 to 25,
u = 100−x−y−z−w.

Chromium and niobium are important elements to improve corrosion resistance and brittleness. They are effective for their purposes within the above-defined ranges of x and y. Substituting metal M' does not alter the essential nature of the alloy and may be added optionally. The presence of more than 8 atom % of substituting metal M' has the risk of reducing the saturated magnetic flux of the alloy. The sum of Cr, Nb and M', that is, (x+y+z) ranges from 2 to 10 atom %. Corrosion resistance will be rather lower with a sum of less than 3 whereas saturation magnetic flux Bs will be rather lower with a some of more than 10.

The content (w) of metalloids, silicon and boron is in the range of from 15 to 38 where an amorphous alloy forms. The silicon and boron may be partially replaced by at least one of phosphorus (P) and carbon (C). Silicon is preferably contained in an amount of 10 to 90 atom %, more preferably 40 to 80 atom % of the total content of metalloids.

Further improved magnetic shielding is achieved when the powder of magnetically soft amorphous alloy according to the present invention has a maximum magnetic permeability $\mu_m$ in the range of from 20 to 50, more preferably from 25 to 40, and a coercive force Hc in the range of from 2 to 13, more preferably from 3 to 10, as measured in a direct current magnetic field.

Preparation

The amorphous alloy may be prepared by any desired one of conventional well-known rapid quenching techniques. One typical technique is disclosed in Japanese Patent Publication No. 61-4302 as comprising melting an ingot having a predetermined alloy composition at a high temperature, spinning the melt against the surface of a rotating single chill roll for rapid quenching, and crushing the resulting ribbon-shaped alloy into coarse grits. Amorphous alloy powder prepared by atomizing, that is, water atomizing and gas atomizing may be similarly used. Water atomizing and gas atomizing are disclosed in Japanese Patent Publication No. 60-14081 and a report entitled "Development of Production Process of Amorphous Alloy Powders" by T. Sato, T. Ichiyama, T. Noda and K. Kumai, in *Bulletin of the Japanese Institute of Metal*, Vol. 24, No. 6, 1985.

Crushing may be carried out by any desired well-known methods. Crushing may start with any desired powders, for example, even a powder of granular grits having an average particle size of from several $\mu$m to about 50 $\mu$m and a powder of a similar size prepared by a well-known powdering method such as water atomizing method.

The crushed alloy is then milled. However, conventional milling means are unsuccessful to comminute ribbons or flakes (obtained by rapid quenching) to a thickness substantially smaller than the initial thickness. Even when particles of a small size are produced, the proportion of such fine particles is very low. For this reason, milling may preferably be carried out in a high shearing action medium-agitating mill, typically an agitator ball mill or bead mill. The agitator ball mill is most preferred. The agitator ball mill is described in Japanese Patent Application Kokai No. 61-259739, for example. The agitator ball mill is a mill capable of imparting an intense shearing action to grits, comprising a pair of outer and inner cylinders having a number of pins standing on the opposing surfaces of the outer and inner cylinders. The space between the outer and inner cylinders is charged with beads as milling medium. The outer and inner cylinders are rotated at a high relative speed.

Unexpectedly, the above-mentioned particle size distribution can be readily accomplished by milling rapidly quenched amorphous alloy in an agitator ball mill. Surprisingly, the agitator ball mill imparts a high shearing force to the amorphous alloy ribbon to reduce the average thickness thereof to about 0.01 to about 1 $\mu$m. There are obtained alloy particles of flat shape, that is, having a certain contour in a major plane and a reduced thickness as viewed from a direction perpendicular to the major plane. The flat particles are irregular, but each have major and minor axes as viewed on the major plane. Milling in an agitator ball mill is effective to produce flat particles having a ratio of major to minor axes, a/b, of at least about 1.2.

The milling process will be conceptually described. This type of agitator ball mill functions to slice particles by a high shearing force and to roll the resulting slices, independent of whether the starting particles are flat or granular. This unique nature of comminution is closely related to the composition of amorphous alloy. A combination of an amorphous alloy of a specific composition with a special type of milling can efficiently produce a magnetic shielding powder of amorphous alloy flakes having specific shape factors. In the prior art, major attention was paid to the manufacture of tough high strength amorphous alloy by rapid quenching in ribbon form. In contrast, the present invention produces a magnetically soft amorphous alloy flake powder from an initially brittle or later embrittled amorphous alloy obtained by rapid quenching.

To further improve magnetic properties, the amorphous alloy particles thus prepared may sometimes be subjected to heat treatment. The heat treatment is generally carried out by heating the particles at a temperature of from about 350 to about 500° C. for about 10 minutes to about 5 hours. The heat treatment is preferably carried out in an inert atmosphere such as nitrogen and argon although the particles may be heat treated in air or a reducing atmosphere free of hydrogen ($H_2$).

Binder

The powder of magnetically soft amorphous alloy particles according to the present invention is dispersed in a binder to formulate a coating composition from which a magnetic shield is formed.

In one preferred embodiment, the magnetic shielding composition contains magnetically soft amorphous alloy powder and a binder in the form of a polyurethane. Preferably, the magnetic shielding composition contains about 60 to about 95% by weight of magnetically soft amorphous alloy particles and the binder. There is a likelihood that a composition containing less than 60% by weight of magnetically soft particles would show a drastically reduced magnetic shielding effect. A composition containing more than 95% by weight of magnetically soft particles is physically weak because the particles cannot be firmly bound by the binder. A composition containing particles in a packing density of from about 70 to about 90% by weight shows a better magnetic shielding effect and is mechanically strong.

The binder preferably includes a urethane polymer. The polyurethanes used herein include either condensation or polymerization products of polyfunctional isocyanates and polyols. They may be homopolymers or copolymers.

Examples of the polyfunctional isocyanates used herein include 2,4-toluenediisocyanate, 2,6-toluenediisocyanate, 1,3-xylenediisocyanate, 1,4-xylenediisocyanate, 1,5-naphthalenediisocyanate, m-phenylenediisocyanate, p-phenelenediisocyanate, 3,3'-dimethyl-4,4'-diphenylmethane diisocyanate, 4,4'-diphenylmethane diisocyanate, 3,3'-dimethylbiphenylenediisocyanate, 4,4'-biphenylenediisocyanate, hexamethylene-diisocyanate, isophoronediisocyanate, dicyclohexylmethane diisocyanate, Desmodur L and Desmodur N (trademark of Bayer AG), and the like.

Examples of the polyols used herein include polyhydric alcohols such as ethylene glycol, diethylene glycol, glycerin, trimethylol propane, 1,4-butanediol, 1,6-hexanediol, pentaerythritol, sorbitol, neopentyl glycol, 1,4-cyclohexane dimethanol, etc. Also contemplated herein are polyester polyols obtained by polycondensation of such polyhydric alcohols with polybasic acids such as phthalic acid, isophthalic acid, terephthalic acid, succinic acid, adipic acid, and sebacic acid; polyether polyols such as polyethylene glycol, polypropylene glycol, and polytetramethylene glycol; caprolactam; and various other polyester polyols such as hydroxyl-containing acrylic acid esters and hydroxyl-containing methacrylic acid esters.

The polyurethane generally has a number average molecular weight of from about 5,000 to about 100,000 although it is not critical to the present invention.

The binder used herein may consist of a polyurethane or a mixture of polyurethane and a thermoplastic resin as shown below.

(1) Vinyl chloride copolymers

Included are vinyl chloride-vinyl acetate-vinyl alcohol copolymers, vinyl chloride-vinyl alcohol copolymers, vinyl chloride-vinyl alcohol-vinyl propionate copolymers, vinyl chloride-vinyl acetate-maleic acid copolymers, vinyl chloride-vinyl acetate-vinyl alcohol-maleic acid copolymers, vinyl chloride-vinyl acetate-OH terminated, alkyl branched copolymers, for example, VROH, VYNC, VYEGX, VERR, VYES, VMCA, VAGH, UCARMMAG 520, and UCARMAG 528 (all trade names, manufactured by U.C.C.), and analogues. These copolymers may additionally contain carboxylic units.

(2) Polyester resins

Included are saturated polyesters obtained by esterifying saturated polybasic acids such as phthalic acid, isophthalic acid, terephthalic acid, succinic acid, adipic acid, sebasic acid, etc. with polyhydric alcohols such as ethylene glycol, diethylene glycol, glycerin, trimethylolpropane, 1,2-propylene glycol, 1,3-butanediol, dipropylene glycol, 1,4-butanediol, 1,6-hexanedio, penteaerithritol, sorbitol, neopentyl glycol, 1,4-cyclohexanedimethanol, etc., and products obtained by modifying these resins with $SO_3Na$ or the like, for example, Vyron 53S (trade name, Toyobo K.K.).

(3) Polyvinyl alcohol resins

Included are polyvinyl alcohol, butyral resins, acetal resins, formal resins, and copolymers of such units.

(4) Epoxy resins and phenoxy resins

Included are epoxy resins formed by reaction of bisphenol-A with epichlorohydrin and methyl epichlorohydrin, for example, Epicoat 152, 154, 828, 1001, 1004, and 1007 (trade names, manufactured by Shell Chemicals), DEN 431, DER 732, DER 511 and DER 331 (trade names, manufactured by Dow Chemicals), Epichlon 400 and 800 (trade names, manufactured by Dai-Nihon Ink K.K.); phenoxy resins which are epoxy resins having a high degree of polymerization, for example, PKHA, PKHC, and PKHH (trade names, manufactured by U.C.C.); and copolymers of brominated bisphenol-A with epichlorohydrin, for example, Epichlon 145, 152, 153, and 1120 (trade names, manufactured by Dai-Nihon Ink K.K.). Also included are carboxyl radical-containing derivatives of the foregoing resins.

(5) Cellulosic derivatives

A variety of cellulosic derivatives may be used although nitrocellulose, cellulose acetobutyrate, ethyl cellulose, butyl cellulose, acetyl cellulose, and analogues are preferred.

Additional examples of the resins include polyfunctional polyester resins, polyether-ester resins, polyvinyl pyrrolidone resins and derivatives (e.g., PVP-olefin copolymers), polyamide resins, polyimide resins, phenol resins, spiro-acetal resins, and acrylic resins containing at least one of hydroxyl-containing acrylates and methacrylates as a polymer component.

Examples of the elastomers, prepolymers and oligomers are presented below.

(i) Acrylonitrile-butadiene copolymerized elastomers

Included are acrylonitrile-butadiene copolymerized prepolymers having a hydroxyl terminal group commercially available as Poly BD Liquid Resin from Sinclair Petro-Chemical and elastomers commercially available as Hiker 1432J from Nihon Zeon K.K.

(ii) Polybutadiene elastomer

Low molecular weight prepolymers having a hydroxyl terminal group commerically available as Poly BD Liquid Resin R-15 from Sinclair Petro-Chemical and the like are preferred because they are compatible with thermoplastic resins.

Also, cyclic products of polybutadienes commercially available as CBR-M901 from Nihon Synthetic Rubber K.K. offer satisfactory quality when combined with thermoplastic resins.

Additional preferred examples of the thermoplastic elastomers and prepolymers include styrene-butadiene rubbers, chlorinated rubbers, acrylic rubbers, isoprene rubbers, and cyclic products thereof (commercially available as CIR 701 from Nihon Synthetic Rubber K.K.) while elastomers, for example, epoxy-modified rubbers and internally plasticized, saturated linear polyesters (commercially available as Vyron #300 from Toyobo K.K.) may also be useful.

When the binder is a mixture of polyurethane and another resin as mentioned above, the content of the other resin is preferably up to 80% by weight based on the weight of the binder.

The magnetic shielding compositon may further contain a curing agent preferably in the form of a polyfunctional isocyanate having —NCO radical. The curing agent is present in an amount of about 5 to 30% by weight of the binder.

In addition to the magnetically soft alloy powder, binder and curing agent, the magnetic shielding composition may further contain a dispersant, stabilizer, coupling agent or the like.

The magnetic shielding composition may be processed into a molding or coating composition by adding a suitable solvent thereto before it is formed into a desired shape and thermoset. Thermosetting may generally be carried out by heating in an oven at a temperature of 50° to 80° C. for about 6 to about 100 hours.

When the magnetic shielding composition is formed into a film or thin plate which functions as a magnetic shield, the film or plate preferably has a thickness of about 5 to about 200 μm. The magnetic shielding composition contains a high packing density of magnetically soft alloy particles. Then a coating thereof has a sufficient even magnetic shielding effect even when it is as thin as 5 μm. A shielding coat need not be more than 200 μm thick in order to provide shielding against a magnetic field having such an intensity that the shield may not be magnetically saturated therein. Also, a coating as thin as 200 μm or less has an advantage of low cost.

In forming or applying a magnetic shielding composition to a predetermined shape or site, a molding or coating capable of providing directional magnetic shielding may be obtained by applying an orientation magnetic field or effecting mechanical orientation. Particularly when the composition is formed or applied as a plate or film, the film shows a good magnetic shielding effect against a magnetic field parallel to the film surface. The film is fully effective even when it has a thickness within the above-defined range.

In another preferred embodiment of the magnetic shielding composition, the binder is a radiation-curable compound.

The radiation-curable compounds used herein may be compounds having an unsaturated ethylenic double bond capable of radical polymerization upon exposure to radiation, such as an acrylic double bond given by acrylic and methacrylic groups, and an allyl double bond. Illustrative examples of the radiation-curable compounds include thermoplastic resins having an unsaturated double bond in their molecule, for example, acrylic resins terminated with an acrylic double bond, unsaturated polyesters.

Also preferred are those thermoplastic resins which have been modified to be radiation sensitive by introducing an unsaturated double bond. The thermoplastic resins which can be modified radiation curable include vinyl chloride-vinyl acetate copolymers, saturated polyester resins, polyvinyl alcohol resins, epoxy resins, phenoxy resins, and cellulosic resins. Examples of these resins are described in U.S. Pat. Nos. 4,720,411, 4,741,977 and 4,726,990; Japanese Patent Publication Nos. 47-12423 and 57-50801; Japanese Patent Application Kokai Nos. 50-77433, 54-36907, 54-124709, 57-58237, 55-97027, 55-125539, 56-2641, 56-8847, 56-11129, 56-25230, 56-25231, 56-25232, 56-25235, 56-122802, 56-124119, 56-130835, 57-3226, 57-15231, 57-24028, 57-24029, 57-40744, 57-40745, 57-40746, 57-40747, 57-40755, 57-44223, 57-58237, 57-86130, 57-86131, 57-92421, 57-127926, 57-130229, 57-150134, 57-150136, 57-162125, 57-164436, 57-169929, 57-195330, 57-200937, 57-200938, 57-208628, 57-208629, 57-210431, 57-210444, 58-3132, 58-3136, 58-15573, 58-29121, 58-29122, 58-32231, 58-32232, 58-32617, 58-32618, 58-35728, 58-68235, 58-146023, 58-146024, 58-218043, 59-24436, 59-65929, 59-82628, 59-146440, 59-17727, 6079521, 60-85415, 60-85423, 61-233414, which are incorporated herein by reference.

Also useful are polyurethane elastomers or prepolymers having an unsaturated double bond, acrylonitrile-butadiene copolymer elastomers, and polybutadiene elastomers. They may have an additional functional group such as a sulfonyl and carboxyl group.

Oligomers or monomers having an unsaturated double bond may be added such as styrene, (meth)acrylates, oligoester acrylates, and (meth)acryl modified urethane elastomers.

Any of the radiation-curable compounds described in the above-incorporated patents may be used.

If necessary, the binder may contain a thermoplastic resin in addition to the radiation-curable compound insofar as the content of the thermoplastic resin ranges up to 80% by weight of the binder.

The use of radiation-curable binder has advantages of brief curing and mass production. The cured film has a sufficient degree of hardness, and is weathering resistant and durable. The cured film has a smooth surface, providing improved shielding effect.

It is generally known that a laminate of shielding films shows an enhanced magnetic shielding effect and a combination of a shielding film with a conductive film is effective. A thermosetting composition is inefficient to form a laminate of shielding films therefrom because time-consuming thermosetting operation is necessary each time a film is coated. In contrast, the use of radiation-curable binder is efficient because crosslinking can be completed almost instantaneously. A laminate of radiation-cured films is free of the risk of flaws and curling which would often occur in a laminate of thermoset shielding films.

In formulating a magnetic shielding composition, the magnetically soft alloy powder and the binder are preferably blended in a volume ratio of from about 2:8 to about 8:2.

In addition to the magnetically soft alloy powder and binder, the magnetic shielding composition may further contain a dispersant, stabilizer, coupling agent or the like.

The magnetic shielding composition may be processed into a molding or coating composition by adding a suitable solvent thereto before it is formed into a desired shape and cured with radiation. The solvent may be any desired one of ester, alcohol, aromatic, ether, and halogenated hydrocarbon solvents. Radiation curing is generally carried out with an electron beam under conditions as described in the above-incorporated patents.

When the magnetic shielding composition is formed into a film or thin plate which functions as a magnetic shield, the film or plate preferably has a thickness of about 5 to about 200 $\mu$m. The magnetic shielding composition contains magnetically soft alloy particles of specific dimensions. Then a coating thereof has a sufficient even magnetic shielding effect even when it is as thin as 5 $\mu$m. A shielding coat need not be more than 200 $\mu$m thick in order to provide shielding against a magnetic field having such an intensity that the shield may not be magnetically saturated therein. Also, a coating as thin as 200 $\mu$m or less is advantageous in cost.

In forming or applying a magnetic shielding composition to a predetermined shape or site, a molding or coating capable of providing directional magnetic shielding may be obtained by applying an orientation magnetic field or effecting mechanical orientation. Particularly when the composition is formed or applied as a plate or film, the film shows a good magnetic shielding effect against a magnetic field parallel to the film surface.

In either of the above embodiments wherein the binders are polyurethane and radiation-curable compound, the magnetic shielding composition preferably has a maximum magnetic permeability of from about 15 to about 70 and a coercive force of from about 5 to about 20 oersted (Oe) as measured in a direct current magnetic field. There is a likelihood that magnetic shielding is insufficient with a maximum magnetic permeability of less than 15. Particles must be large in order that the composition have a maximum magnetic permeability of more than 70, and a less even coating is formed from such large particles which provides less shielding effect. Magnetic shielding is short with a composition having a coercive force of more than 20 Oe. Particles must be large in order that the composition have a coercive force of less than 5 Oe. This brings the same drawback as above. Better results are obtained when the composition has a maximum magnetic permeability of from about 18 to about 60, especially from about 25 to about 60, and a coercive force of from about 7 to about 18 Oe, especially from about 7 to about 15 Oe.

BENEFITS OF THE INVENTION

In a first embodiment of the present invention, the magnetic shielding powder is comprised of magnetically soft amorphous alloy particles of flat shape having specific thickness and aspect ratio. Since the flakes are flat and fine, they can be evenly dispersed in a binder. The resulting composition provides good magnetic shielding with little local variation. When a film is formed from a coating composition of flakes and binder, magnetic anisotropy is naturally accomplished within the plane of the film because of flatness of the flakes. The film then provides high shielding effect perpendicular to the film surface. If magnetic orientation is carried out during film formation, the resulting shield provides directional magnetic shielding.

In a second embodiment, the magnetic shielding powder is comprised of magnetically soft amorphous alloy particles further having a specific major-to-minor axis ratio. The magnetic shield containing such flakes can substantially reduce the leakage of magnetic flux therethrough.

In a third embodiment, the magnetic shielding powder has a specific distribution of particle size. The powder can be more evenly dispersed in a binder in a higher concentration. The shield provides a higher shielding effect with no local variation. Then a desired shielding effect is achieved even when a shielding film or plate is formed as thin as about 5 to about 200 $\mu$m. The composition finds a wider variety of applications including magnetic shields for speakers and cathode ray tubes. A cost reduction is another advantage.

The advantages of the third embodiment are more efficiently accomplished when the magnetically soft amorphous alloy flakes have specific coercive force and maximum magnetic permeability or when the shielding composition has specific coercive force and maximum magnetic permeability.

The same applies when the shielding composition contains a binder in the form of polyurethane or radiation-curable compound. The use of radiation curable binder had additional advantages of brief curing and mass production. The cured film has a sufficient degree of hardness, and is weathering resistant and durable.

Where the powder is comprised of magnetically soft amorphous alloy of Fe-B-Si system wherein iron is partially replaced by chromium, the resulting shield is resistant to corrosion. Little or no rust occurs even under severe corrosive conditions.

EXAMPLES

Examples of the present invention will be given below by way of illustration and not by way of limitation.

Prior Art Example

Several batches of powdery shreds of rapidly quenched amorphous alloy $Fe_{80}Si_{10}B_{10}$ having an average outer diameter of 78 $\mu$m and an average thickness of 24 $\mu$m were milled in a variety of mills for about 1 hour. The mills used were a stamp mill, dry vibratory mill, wet vibratory mill, attritor, and jet mill. The resutling powders were determined for shape, average outer diameter (D50) and average thickness (t). It was also examined whether the powder could be dispersed in a binder to form a coating composition.

The results are shown in Table 1.

TABLE 1

| | Shape | D50 (μm) | t (μm) | Dispersibility |
|---|---|---|---|---|
| Stamp mill | flat | 75 | 24 | no |
| Dry vibratory mill | flat | 40 | 20 | no |
| Wet vibratory mill | flat | 52 | 22 | no |
| Attritor | flat | 61 | 23 | no |
| Jet mill | granular | 14 | 14 | no |

Two batches of powdery shreds of rapidly quenched amorphous alloy $Fe_{70}Cr_5Si_{16}B_9$ having an average outer diameter of 106 μm and an average thickness of 19 μm were milled in a dry vibratory mill and a jet mill for about 1 hour. The resulting powders were examined as above.

The results are shown in Table 2.

TABLE 2

| | Shape | D50 (μm) | t (μm) | Dispersibility |
|---|---|---|---|---|
| Dry vibratory mill | flat | 34 | 19 | no |
| Jet mill | granular | 7 | 7 | no |

With a conventional mill such as a stamp mill, one-hour milling failed to mill the powder to such an extent that the powder might be readily dispersed in a binder to form a coating composition. The average thickness changed little from the original value. The only exception is a jet mill with which milling proceeded to a greater extent although particles became granular rather than flat. In some of the following examples, a jet mill is used to compare with milling with an agitator ball mill according to the present invention.

EXAMPLE 1

Powders of $Fe_{74}Cr_3Nb_3Si_8B_{12}$ and $Fe_{80}Si_{10}B_{10}$ alloys both having an average particle size of 20 μm were prepared by milling each alloy in a vibratory ball mill for a sufficient time. The powders were further milled until they were fine enough to be dispersed in a binder. The former powder was milled in a high shearing force mill, that is, agitator ball mill (invention). The latter powder was divided into two portions which were milled in an agitator ball mill (invention) and a jet mill (comparison). The agitator ball mill was charged with 80 vol % of beads having a diameter of 1.5 mm and operated at a circumferential speed of 7.8 m/sec. The jet mill was operated under a gas pressure of 6 kg/cm² to mill 500 grams of powder per hour.

The resulting powders were determined for average outer diameter (D50), average thickness (t) and examined whether they could be dispersed in an epoxy resin binder.

A shielding ratio was determined as follows. The powder was dispersed in an epoxy resin binder to prepare a coating composition which was formed into a magnetic shielding film of about 20 μm thick. The shielding film was placed at a certain distance from one side of S-N opposed magnetic poles to determine a leakage magnetic flux φ. The shielding ratio (φ/φ0) was determined by dividing the leakage magnetic flux φ by the magnetic flux φ0 determined without the shielding film and expressed in percent.

Corrosion resistance (CR) was examined by immersing a shielding film in 5% salt water for 24 hours and observing the film whether it rusted. The sample was evaluated OK when it did not rust and NO when it rusted.

The results are shown in Table 3.

TABLE 3

| | D50 (μm) | t (μm) | Dispersibility | φ/φ0 | CR |
|---|---|---|---|---|---|
| $Fe_{74}Cr_3Nb_3Si_8B_{12}$ Agitator ball mill | 12 | 0.15 | OK | 7% | OK |
| $Fe_{80}Si_{10}B_{10}$ | 14 | 14 | NO | — | NO |
| Jet mill | 5 | 5 | OK | 65% | NO |
| Agitator ball mill | 18 | 0.2 | OK | 7% | NO |

As seen from Table 3, the prior art technique or jet mill produced granular amorphous alloy particles and a magnetic shield prepared therefrom allowed about 65% of the magnetic flux to leak therethrough. In contrast, the magnetic shield of the present invention allowed only about 7% of the magnetic flux to leak therethrough. This value is well below the standard value of about 20% leakage which is desired for commercial magnetic shields.

When high corrosion resistance is required, the use of Fe-Si-B alloy having iron partially replaced by chromium is advantageous.

EXAMPLE 2

Powders of $Fe_{72}Cr_3Mo_3Si_{13}B_9$ and $Fe_{80}Si_{10}B_{10}$ alloys both having an average particle size of 20 μm were prepared by milling each alloy in a vibratory ball mill for a sufficient time. The powders were further milled until they were fine enough to be dispersed in a binder. An agitator ball mill was loaded with each of the powders and operated in varying circumferential speeds (SP). The powders were determined for average outer diameter (D50), average thickness (t), shielding ratio (φ/φ0), and corrosion resistance (CR).

The results are shown in Table 4.

TABLE 4

| Run No. | SP (m/sec.) | D50 (μm) | t (μm) | φ/φ0 | CR |
|---|---|---|---|---|---|
| $Fe_{80}Si_{10}B_{10}$ | | | | | |
| 1* | 1 | 20 | 20 | — | NO |
| 2* | 3 | 20 | 5 | 60% | NO |
| 3 | 5 | 18 | 0.3 | 10% | NO |
| 4 | 10 | 14 | 0.05 | 4% | NO |
| $Fe_{72}Cr_3Mo_3Si_{13}B_9$ | | | | | |
| 5* | 1 | 20 | 20 | — | OK |
| 6* | 3 | 18 | 5 | 60% | OK |
| 7 | 5 | 16 | 0.25 | 9% | OK |
| 8 | 10 | 12 | 0.04 | 3% | OK |

*outside the scope of the present invention

As seen from Table 4, it is critical for pins to agitate beads at a sufficiently high speed to exert a high shearing force.

EXAMPLE 3

The powder milled in the jet mill in Example 1 (Table 3) having a D50 of 5 μm was determined for maximum magnetic permeability ($\mu_m$). The same charges were milled into flat particles having dimensions falling within the scope of the present invention and determined for maximum magnetic permeability. Each of the powders was dispersed in a binder to prepare a coating composition, which was formed into a magnetic shielding film of 20 μm thick to determine the shielding ratio (φ/φ0).

The results are shown in Table 5. Sample Nos. 31, 32 and 33 are of $Fe_{80}Si_{10}B_{10}$ alloy and sample Nos. 34 and 35 are of $Fe_{65}Cr_2Ni_8Si_{17}B_8$ alloy.

TABLE 5

| Sample | Shape | Dimensions | $\mu_m$ | $\phi/\phi0$ | CR |
|---|---|---|---|---|---|
| 31* | granular | 5 μm | 7.5 | 65% | NO |
| 32 | flat | 30 μm × 0.5 μm (thick) | 20 | 20% | NO |
| 33 | flat | 20 μm × 0.1 μm (thick) | 30 | 5% | NO |
| 34 | flat | 45 μm × 0.4 μm (thick) | 25 | 10% | OK |
| 35 | flat | 25 μm × 0.2 μm (thick) | 28 | 6% | OK |

*outside the scope of the invention

As seen from Table 5, the aspect ratio of powder is correlated to the maximum magnetic permeability and shielding ratio of a magnetic shield containing the powder. Sample Nos. 32, 33, 34, and 35 have an aspect ratio of 60, 200, 112, and 225, respectively. The higher the aspect ratio, the better the magnetic shielding effect is. Flakes tend to orientate in a planar direction so that the axes of easy magnetization are aligned parallel within the plane.

It is also observed that the addition of Cr and Ni to Fe-Si-B alloy system improves corrosion resistance.

EXAMPLE 4

Sample No. 41, 42 and 43 are alloys having the following composition.

No. 41 $Fe_{80}Si_{10}B_{10}$
No. 42 $Fe_{68}Cr_3Nb_3Si_{18}B_8$
No. 43 $Fe_{67}Cr_3Nb_1Mo_2Si_9B_{18}$

Each sample was ground in a vibratory ball mill into grits having an average particle size of 20 μm, which were further milled in an agitator ball mill. The agitator ball mill was charged with 80 vol % of beads having a diameter of 1.5 mm and operated at a circumferential speed of 7.8 m/sec. The resulting powders were determined for average outer diameter (D50), average thickness (t), aspect ratio, a/b, shielding ratio ($\phi/\phi0$), and corrosion resistance (CR).

The results are shown in Table 6.

TABLE 6

| Sample | Milling time (hr.) | D50 (μm) | t (μm) | Aspect ratio | a/b | $\phi/\phi0$ | CR |
|---|---|---|---|---|---|---|---|
| 41-a | 7 | 19 | 1.4 | 14 | 1.03 | 35% | NO |
| 41-b | 9 | 18 | 1.0 | 18 | 1.12 | 21% | NO |
| 41-c | 11 | 18 | 0.8 | 23 | 1.15 | 20% | NO |
| 42-a | 7 | 19 | 0.19 | 100 | 1.3 | 10% | OK |
| 42-b | 9 | 17 | 0.13 | 131 | 1.8 | 5% | OK |
| 42-c | 11 | 14 | 0.11 | 127 | 2.5 | 5% | OK |
| 43-a | 7 | 18 | 0.15 | 120 | 1.6 | 6% | OK |
| 43-b | 9 | 16 | 0.08 | 200 | 2.0 | 4% | OK |
| 43-c | 11 | 12 | 0.05 | 240 | 3.1 | 3% | OK |

A comparison of sample No. 41-a with Nos. 41-b and 41-c shows that even flat particles having a sufficient aspect ratio will give a relatively high shielding ratio as their thickness is increased beyond 1 μm. It is thus desired to use flat particles having an average thickness of up to 1 μm. The average major-to-minor axis ratio (a/b) increases with milling time. It was also found that sample Nos. 42 and 43 were fully corrosion resistant.

EXAMPLE 5

A series of powders having varying major-to-minor axis ratios (a/b) were prepared from amorphous alloys having a composition falling within the polygon ABCDEFGH in FIG. 1. For ease of comparison, all the powders used in this experiment had an average outer diameter of about 52 μm and an average thickness of about 0.9 μm. Each powder was dispersed in an epoxy resin binder to prepare a coating composition. A magnetic shielding film of about 20 μm thick was formed from the composition while an orientating magnetic filed was applied parallel or perpendicular to the surface of the film.

The shielding ratio of leakage magnetic flux ($\phi$) to unshielded magnetic flux ($\phi0$) was plotted as a function of a/b. The leakage ($\phi$) through a shield whose axis of easy magnetization is parallel to the magnetic field of a magnet to be shielded decreases with a/b and to about 20% or lower when a/b increases to about 1.2 or higher. The leakage ($\phi$) through a shield whose axis of easy magnetization is perpendicular to the magnetic field of a magnet to be shielded remained as high as about 80 to about 90% independent of a/b.

EXAMPLE 6

A series of powders having an average outer diameter of 30 μm and an average thickness of 0.2 μm were prepared from various alloys having a composition falling within the polygon ABCDEFGH in FIG. 1. The powders were formed into magnetic shielding films of about 20 μm thick by the same procedure as in Example 1. They were measured for shielding ratio ($\phi/\phi0$). All the films had a shielding ratio of up to 5%. This is because the powders had a high aspect ratio of 150 and a sufficient a/b. The shielding ratio ($\phi/\phi0$) of up to 0.05 (5% leakage) is almost the highest value for this type of shielding film. The best performance was achieved with an alloy having a composition indicated by the point (o) immediately below point F in FIG. 1.

The following example focuses on the particle size distribution of magnetically soft amorphous alloy powder.

EXAMPLE 7

Each of magnetically soft amorphous alloys having the composition shown in Table 7 was ground in a vibratory ball mill to a powder of coarse particles having an average particle size of 20 μm. The powder was then milled in an agitator ball mill, obtaining magnetically soft powder sample Nos. 101 to 110 for forming magnetic shields.

The agitator ball mill was operated under the conditions shown in Table 7. The powders were examined for various properties including average outer diameter, average thickness, aspect ratio (ratio of average outer diameter to average thickness), major-to-minor axis ratio (a/b), and particle size distribution. The particle size distribution is expressed by the amount (% by weight) of fractions A, B and C.

A: particles having a size of 10 to 50 μm
B: particles having a size of more than 88 μm
C: particles having a size of less than 3 μm The particle size distribution and average outer diameter were measured by a granulometer. The average thickness and major-to-minor axis ratio were measured under a scanning electron microscope for analysis.

These attributes are shown in Table 7.

Each of the magnetically soft alloy powder sample Nos. 101 to 110 was dispersed in an epoxy resin binder to prepare a coating composition. The composition contained the powder and the epoxy resin in a volume ratio of 1:1.

The coating composition was coated onto a polyethylene terephthalate (PET) substrate of 75 μm thick to a thickness of 100 μm to form a magnetic shielding plate. The shielding ratio of the plate was determined by placing the shielding plate on a magnet, determining a leakage magnetic flux φ at a location 0.5 cm apart from the shielding plate, and dividing the leakage magnetic flux φ by the magnetic flux φ0 determined without the shielding plate. The result is expressed as a relative value on the basis of the shielding ratio of sample No. 109 which is assumed to be 1.

The results are shown in Table 7.

C: particles having a size of less than 3 μm

The particle size distribution and average outer diameter were measured by a granulometer. The average thickness was measured under a scanning electron microscope for analysis. These attributes are shown in Table 8.

The magnetically soft alloy powder samples were also measured for magnetic properties including a maximum magnetic permeability ($\mu_m$) and a coercive force (Hc) in a direct current magnetic field. The results are also shown in Table 8.

A coating composition was prepared by bleinding

TABLE 7

| Sample No. | Alloy Composition | Magnetically soft powder | | | | | | Milling | | | Shielding ratio (relative) |
|---|---|---|---|---|---|---|---|---|---|---|---|
| | | Size distribution | | | | | | | | | |
| | | A (wt %) | B (wt %) | C (wt %) | t (μm) | Aspect ratio | a/b | CS (m/sec) | Bead diameter (mm) | Bead charge (%) | |
| 101 | 6Cr—2V—16Si—6B-balFe | 83 | 0.1 | 5 | 0.5 | 30 | 1.2 | 5 | 2 | 80 | 0.56 |
| 102 | 6Cr—2Ta—16Si—6B-balFe | 82 | 0.3 | 9 | 0.5 | 30 | 1.2 | 5 | 2 | 80 | 0.44 |
| 103 | 6Cr—2Nb—16Si—6B-balFe | 85 | 0 | 3 | 0.5 | 30 | 1.2 | 5 | 2 | 80 | 0.44 |
| 104 | 4Cr—1Mo—18Si—8B-balFe | 65 | 0 | 2 | 0.3 | 67 | 1.5 | 5 | 2 | 40 | 0.33 |
| 105 | 4Cr—1Mo—18Si—8B-balFe | 60 | 0 | 3 | 0.2 | 80 | 2.5 | 5 | 0.8 | 80 | 0.22 |
| 106 | 5Cr—2Mo—13Si—13B-balFe | 45 | 0 | 5 | 0.3 | 33 | 1.7 | 7.8 | 1.5 | 80 | 0.56 |
| 107 | 6Cr—2Nb—16Si—6B-balFe | 46 | 0.5 | 30 | 0.5 | 30 | 1.2 | 5 | 2 | 60 | 3.6 |
| 108 | 6Cr—2Nb—16Si—6B-balFe | 69 | 3.0 | 21 | 0.5 | 30 | 1.2 | 5 | 2 | 60 | 2.2 |
| 109 | 6Cr—2Nb—16Si—6B-balFe | 78 | 1.8 | 12 | 0.5 | 30 | 1.2 | 6.5 | 2 | 60 | 1 |
| 110 | 6Cr—2Nb—16Si—6B-balFe | 30 | 0 | 15 | 0.5 | 30 | 1.2 | 6 | 1.5 | 70 | 2.2 |

Shielding plate sample No. 108 showed some local variation in shielding effect.

The following example focuses on the magnetic properties (maximum magnetic permeability and coercive force) of magnetically soft amorphous alloy powder.

EXAMPLE 8

Each of magnetically soft amorphous alloys having the composition shown in Table 8 was ground in a vibratory ball mill to a powder of coarse particles having an average particle size of 32 μm. The powder was then milled in an agitator ball mill and then heat treated, obtaining magnetically soft powder sample Nos. 201 to 206 for forming magnetic shields.

The agitator ball mill was operated under the conditions shown in Table 8. The heat treatment was reported in Table 8 as heat treatment I, II, and III which were carried out in a nitrogen (N$_2$) atmosphere under the following conditions.

| Heat treatment | Temperature | Time |
|---|---|---|
| I | 450° C. | 1 hour |
| II | 400° C. | 1 hour |
| III | 350° C. | 1 hour |

The powders were examined for various properties including average thickness, aspect ratio (ratio of average outer diameter to average thickness), and particle size distribution. The particle size distribution is expressed by the amount (% by weight) of fractions A, B and C.

A: particles having a size of 10 to 50 μm
B: particles having a size of more than 88 μm each of the magnetically soft alloy powder sample Nos. 201 to 206 with a binder, a curing agent and a solvent as shown below.

| | Parts by weight |
|---|---|
| Binder | |
| Vinyl chloride-vinyl acetate copolymer (Eslek A by Sekisui Chemical K.K.) | 100 |
| Polyurethane (Nippolane 2304 by Nihon Polyurethane K.K.) | 100* |
| Curing agent | |
| Polyisocyanate (Colonate HL by Nihon Polyurethane K.K.) | 10 |
| Solvent | |
| Methylethylketone | 850 |

*calculated as solids content

The packing density which is the percentage by weight of the powder in the coating composition excluding the solvent is reported in Table 8.

The coating composition was coated onto a polyethylene terephthalate (PET) substrate of 75 μm thick to a thickness of 100 μm and cured by heating at 60° C. for 60 minutes, forming a magnetic shielding plate.

The shielding ratio of the plate was determined by placing the shielding plate on a magnet, determining a leakage magnetic flux φ at a location 0.5 cm apart from the shielding plate, and dividing the leakage magnetic flux φ by the unshielded magnetic flux φ0. The result is expressed as a relative value on the basis of the shielding ratio of sample No. 205 which is assumed to be 1. The results are shown in Table 8.

The shielding plates were also measured for magnetic properties including a maximum magnetic permeability ($\mu_m$) and a coercive force (Hc) in a direct current magnetic field. The results are also shown in Table 8.

TABLE 8

| Sample No. | Alloy Composition | Milling | | | Heat treatment | Magnetically soft powder | | | | | | | Packing density (wt %) | Shielding film | | Shielding ratio (relative) |
|---|---|---|---|---|---|---|---|---|---|---|---|---|---|---|---|---|
| | | CS (m/s) | Bead diameter (mm) | Bead charge (%) | | A (wt %) | B (wt %) | C (wt %) | t (μm) | Aspect ratio | μm | Hc (Oe) | | μm | Hc (Oe) | |
| 201 | $Fe_{69}Cr_4Mo_1Si_{18}B_8$ | 5 | 2 | 80 | I | 60 | 0 | 3.0 | 0.1 | 140 | 25 | 10 | 80 | 33 | 13 | 0.3 |
| 202 | $Fe_{69}Cr_4Ta_1Si_{18}B_8$ | 5 | 2 | 80 | I | 55 | 0 | 5.0 | 0.2 | 65 | 27 | 7 | 80 | 40 | 11 | 0.23 |
| 203 | $Fe_{67}Cr_5Nb_2Si_{13}B_{13}$ | 5 | 2 | 80 | I | 63 | 0.05 | 2.6 | 0.07 | 290 | 38 | 3 | 80 | 55 | 7 | 0.1 |
| 204 | $Fe_{67}Cr_5Nb_2Si_{13}B_{13}$ | 5 | 2 | 80 | II | 63 | 0.05 | 2.6 | 0.07 | 290 | 35 | 4 | 80 | 42 | 10 | 0.13 |
| 205 | $Fe_{67}Cr_5Nb_2Si_{13}B_{13}$ | 5 | 2 | 80 | III | 63 | 0.05 | 2.6 | 0.07 | 290 | 17 | 35 | 80 | 13 | 41 | 1 |
| 206 | $Fe_{67}Cr_5Nb_2Si_{13}B_{13}$ | 4 | 2 | 40 | I | 45 | 3.0 | 1.5 | 0.2 | 220 | 56 | 1 | 80 | 75 | 4 | 0.07~0.33 |

Shielding plate sample No. 206 showed some local variation in shielding effect.

A shielding composition based on magnetically soft alloy powder and a polyurethane binder will be illustrated by the following example.

EXAMPLE 9

Each of magnetically soft amorphous alloys having the composition shown in Table 9 was ground in a vibratory ball mill to a powder of coarse particles having an average particle size of 32 μm. The powder was then milled in an agitator ball mill, obtaining magnetically soft powder sample Nos. 301 to 310 for forming magnetic shields.

The agitator ball mill was operated under the conditions shown in Table 9. The powders were examined for various properties including average thickness, aspect ratio (ratio of average outer diameter to average thickness), and particle size distribution. The particle size distribution is expressed by the amount (% by weight) of fractions A, B and C.

A: particles having a size of 10 to 50 μm
B: particles having a size of more than 88 μm
C: particles having a size of less than 3 μm The particle size distribution and average outer diameter were measured by a granulometer. The average thickness was measured under a scanning electron microscope for analysis. These attributes are shown in Table 9.

A coating composition was prepared by blending each of the magnetically soft alloy powder sample Nos. 301 to 310 with a binder, a curing agent and a solvent as shown below.

| | Parts by weight |
|---|---|
| Binder | |
| Vinyl chloride-vinyl acetate copolymer (Eslek A by Sekisui Chemical K.K.) | 100 |
| Polyurethane (Nippolane 2304 by Nihon Polyurethane K.K.) | 100* |
| Curing agent | |
| Polyisocyanate (Colonate HL by Nihon Polyurethane K.K.) | 10 |
| Solvent | |
| Methylethylketone | 850 |

*calculated as solids content

The packing density which is the percentage by weight of the powder in the coating composition excluding the solvent is reported in Table 9.

The coating composition was coated onto a polyethylene terephthalate (PET) substrate of 75 μm thick to a thickness of 100 μm and cured by heating at 60° C. for 60 minutes, forming a magnetic shielding plate.

The shielding ratio of the plate was determined by placing the shielding plate on a magnet, determining a leakage magnetic flux $\phi$ at a location 0.5 cm apart from the shielding plate, and dividing the leakage magnetic flux $\phi$ by the unshielded magnetic flux $\phi 0$. The result is expressed as a relative value on the basis of the shielding ratio of sample No. 309 which is assumed to be 1. The results are shown in Table 9.

The shielding plates were also subjected to a bending test to examine whether cracks occured in the shielding film or the shielding film separated from the PET substrate. In the test, the shielding plate was turned an angle of 180° so that the PET substrate was folded inside. The results are shown in Table 9 in which symbol X indicates cracking and/or separation and symbol 0 indicate no cracking or separation.

TABLE 9

| Sample No. | Alloy Composition | Milling CS (m/s) | Bead diameter (mm) | Bead charge (%) | Magnetically soft powder A (wt %) | B (wt %) | C (wt %) | t (μm) | Aspect ratio | Packing density (wt %) | Shielding ratio (relative) | Bend test |
|---|---|---|---|---|---|---|---|---|---|---|---|---|
| 301 | $Fe_{69}Cr_4Mo_1Si_{18}B_8$ | 5 | 2 | 80 | 60 | 0 | 3.0 | 0.1 | 140 | 80 | 0.6 | O |
| 302 | $Fe_{69}Cr_4Ta_1Si_{18}B_8$ | 5 | 2 | 80 | 55 | 0 | 5.0 | 0.2 | 65 | 80 | 0.9 | O |
| 303 | $Fe_{69}Cr_4Nb_1Si_{18}B_8$ | 5 | 2 | 80 | 60 | 0.05 | 4.4 | 0.1 | 150 | 80 | 0.5 | O |
| 304 | $Fe_{67}Cr_5Nb_2Si_{13}B_{13}$ | 5 | 2 | 80 | 63 | 0.05 | 2.6 | 0.07 | 290 | 70 | 0.3 | O |
| 305 | $Fe_{67}Cr_5Nb_2Si_{13}B_{13}$ | 5 | 2 | 80 | 63 | 0.05 | 2.6 | 0.07 | 290 | 90 | 0.3 | O |
| 306 | $Fe_{67}Cr_5Nb_2Si_{13}B_{13}$ | 5 | 2 | 80 | 63 | 0.05 | 7 | 0.07 | 290 | 55 | 2.5 | O |
| 307 | $Fe_{67}Cr_5Nb_2Si_{13}B_{13}$ | 5 | 2 | 80 | 63 | 0.05 | 7 | 0.07 | 290 | 96 | 0.2 | X |
| 308 | $Fe_{67}Cr_5Nb_2Si_{13}B_{13}$ | 7.5 | 2 | 80 | 51 | 0 | 4 | 0.1 | 100 | 70 | 0.8 | O |
| 309 | $Fe_{67}Cr_5Nb_2Si_{13}B_{13}$ | 4 | 2 | 80 | 65 | 0.4 | 3 | 0.2 | 90 | 70 | 1 | O |
| 310 | $Fe_{67}Cr_5Nb_2Si_{13}B_{13}$ | 6.5 | 2 | 60 | 44 | 0 | 7 | 0.2 | 50 | 70 | 0.9 | O |

A shielding composition based on magnetically soft alloy powder and a radiation-curable binder will be illustrated by the following example.

EXAMPLE 10

Each of magnetically soft amorphous alloys having the composition shown in Table 10 was ground in a vibratory ball mill to a powder of coarse particles having an average particle size of 20 μm. The powder was then milled in an agitator ball mill, obtaining magnetically soft powder sample Nos. 401 to 405 for forming magnetic shields.

The agitator ball mill was operated under the conditions shown in Table 10. The powders were examined for various properties including average thickness, aspect ratio (ratio of average outer diameter to average thickness), major-to-minor axis ratio (a/b) and particle size distribution. The particle size distribution is expressed by the amount (% by weight) of fractions A, B and C.

A: particles having a size of 10 to 50 μm
B: particles having a size of more than 88 μm
C: particles having a size of less than 3 μm The particle size distribution and average outer diameter were measured by a granulometer. The average thickness and major-to-minor axis ratio were measured under a scanning electron microscope for analysis. These attributes are shown in Table 10.

Separately, a binder composition was prepared by fully mixing the following ingredients into a solution.

| Ingredient | Parts by weight |
|---|---|
| Vinyl chloride-vinyl acetate-vinyl alcohol copolymer (polymerization | 6 (solids) |

-continued

| Ingredient | Parts by weight |
|---|---|
| degree $\overline{D}$ = 500) | |
| Acrylic double bond-incorporated vinyl chloride-vinyl acetate-vinyl alcohol copolymer ($\overline{D}$ = 500) | 12 (solids) |
| Acrylic double bond-incorporated polyether urethane elastomer (MW = 40,000) | 9 (solids) |
| Trimethylolpropane acrylate | 3 |
| Solvent (50/50 MEK/toluene) | 200 |
| Stearic acid | 4 |
| Butyl stearate | 2 |

The binder composition was added to a ball mill along with each of the magnetically soft alloy powder sample Nos. 401 to 405 and milled for dispersion for a further 42 hours. There was obtained a coating composition. The composition contained the powder and the binder in a volume ratio of 1:1.

The coating composition was coated onto a polyethylene terephthalate (PET) substrate of 75 μm thick by gravure coating. The solvent was evaporated off under a far-infrared lamp or with hot air. After the coating was calendered to smoothen the surface thereof, the coating was cured by exposing it to an electron beam in a nitrogen atmosphere by means of an electron curtain type electron accelerator (by ESI Company). The machine was operated at an accelerating voltage of 150 keV and an electrode current 20 mA to a total dose of 5 Mrad.

There was obtained a magnetic shielding plate in the form of a PET substrate of 75 μm thick covered with a shielding film of 100 μm thick.

The shielding ratio of the plate was determined by placing the shielding plate on a magnet, determining a leakage magnetic flux φ at a location 0.5 cm apart from the shielding plate, and dividing the leakage magnetic flux φ by the unshielded magnetic flux φ0. The result is expressed as a relative value on the basis of the shielding ratio of sample No. 101 which is assumed to be 1. The results are shown in Table 10.

$Fe_uM_v(Si,B)_w$ wherein M is at least one metal selected from the group consisting of Cr, Nb, Ti, V, Ta, Mo, W, Mn, Co, and Ni; u, v and w are the atom percentages of Fe, M and Si+B, respectively, and are v=0 to 10, w=15 to 38 and u=100−v−w.

2. The powder of claim 1, wherein said flakes have a major axis to minor axis ratio of at least about 1.2 and exhibit a contour having major and minor axes in a projected plane.

3. The powder of claim 1, wherein the alloy has a composition which falls within the polygon described by points A through H in the ternary composition diagram of FIG. 1 where each coordinate point is as follows:
A (63, 32, 5)
B (62, 23, 15)
C (63, 15, 22)
D (68, 5, 27)
E (80, 5, 15)
F (77, 7, 16),
G (75, 13, 12), and
H (77, 18, 5).

4. The powder of claim 1 wherein the alloy consists essentially of three elements: iron Fe, boron B, and silicon Si.

5. The powder of claim 4, wherein the alloy has a composition defined by points A through H, as these points represent a polygon, in the ternary composition diagram of FIG. 1, where each coordinate point is defined by the atom percents of Fe, B and Si and each point is defined as follows:
A (63, 32, 5)
B (62, 23, 15)
C (63, 15, 22)
D (68, 5, 27)
E (80, 5, 15)
F (77, 7, 16),

TABLE 10

| | | Magnetically soft powder | | | | | | Milling | | | | |
|---|---|---|---|---|---|---|---|---|---|---|---|---|
| | | Size distribution | | | | | | | Bead | Bead | | Shielding |
| Sample No. | Alloy Composition | A (wt %) | B (wt %) | C (wt %) | t (μm) | Aspect ratio | a/b | CS (m/sec) | diameter (mm) | charge (%) | Binder | ratio (relative) |
| 401 | 6Cr—2V—16Si—6B-balFe | 83 | 0.1 | 5 | 0.5 | 30 | 1.2 | 5 | 2 | 80 | A | 0.88 |
| 101 | 6Cr—2V—16Si—6B-balFe | 83 | 0.1 | 5 | 0.5 | 30 | 1.2 | 5 | 2 | 80 | B | 1 |
| 402 | 6Cr—2Ta—16Si—6B-balFe | 82 | 0.3 | 9 | 0.5 | 30 | 1.2 | 5 | 2 | 80 | A | 0.72 |
| 403 | 6Cr—2Nb—16Si—6B-balFe | 85 | 0 | 3 | 0.5 | 30 | 1.2 | 5 | 2 | 80 | A | 0.69 |
| 404 | 4Cr—1Mo—18Si—8B-balFe | 65 | 0 | 2 | 0.3 | 67 | 1.5 | 5 | 2 | 40 | A | 0.48 |
| 405 | 4Cr—1Mo—18Si—8B-balFe | 60 | 0 | 3 | 0.2 | 80 | 2.5 | 5 | 0.8 | 80 | A | 0.31 |

Obviously, numerous modifications and variations of the present invention are possible in light of the above teachings. It is therefore to be understood that within the scope of the appended claims, the invention may be practiced otherwise than as specifically described herein.

We claim:

1. A powder suitable for forming a magnetic shield, comprising:
flakes of magnetically soft amorphous alloy having an average thickness of from about 0.01 to about 1 μm and an aspect ratio, defined as average outer diameter divided by average thickness of from about 10 to about 10,000, said soft amorphous alloy being an alloy of a ternary composition having the formula:

G (75, 13, 12), and
H (77, 18, 5).

6. The powder of claim 4 wherein the boron is partially replaced by at least one of phosphorus and carbon.

7. The powder of claim 1 wherein M is chromium Cr and v is a positive number of more than 0.

8. The powder of claim 7 wherein v is a positive number of 2 to 10.

9. The powder of claim 1 wherein M is a mixture of chromium Cr and niobium Nb and v is a positive number of more than 0.

10. The powder of claim 9 wherein about 2 to about 9 atom % of chromium and about 1 to about 8 atom % of niobium are present and v is a positive number of 3 to 10.

11. The powder of claim 1 wherein M is a mixture of chromium Cr and at least one of molybdenum Mo and nickel Ni and v is a positive number of more than 0.

12. The powder of any one of claims 7 to 11 wherein the boron is partially replaced by at least one of phosphorus and carbon.

13. The powder of any one of claims 7-11, wherein the alloy has a composition defined by the coordinate points A through H, in the ternary composition diagram of FIG. 1, wherein each coordinate point is defined by the atom percents of Fe +M, B and Si and points A through H are defined as follows:
A (63, 32, 5)
B (62, 23, 15)
C (63, 15, 22)
D (68, 5, 27)
E (80, 5, 15)
F (77, 7, 16),
G (75, 13, 12), and
H (77, 18, 5).

14. The powder of claim 1 which has a maximum magnetic permeability of at least about 20.

15. The powder of claim 1 which comprises
at least 35% by weight of magnetically soft amorphous alloy flakes having a particle size of from 10 to 50 μm,
up to 0.5% by weight of magnetically soft amorphous alloy flakes having a particle size of more than 88 μm, and
up to 10% by weight of magnetically soft amorphous alloy flakes having a particle size of less than 3 μm.

16. A magnetically shielding composition, comprising:
a powder of flakes of magnetically soft amorphous alloy with the flakes having an average thickness ranging from about 0.01 to about 1 μm and an aspect ratio, defined as average outer diameter divided by average thickness, of from about 10 to about 10,000, said soft amorphous alloy being of a ternary composition of the formula:

$Fe_u M_v (Si,B)_w$ wherein M is at least one metal selected from the group consisting of Cr, Nb, Ti, V, Ta, Mo, W, Mn, Co, and Ni; u, v and w are the atom percentages of Fe, M and Si+B, respectively, and are v=0 to 10, w=15 to 38 and u=100−v−w; and
a binder.

17. The composition of claim 16, wherein said flakes have a major axis to minor axis ratio of at least about 1.2 and exhibit a contour having major and minor axes in a projected plane.

18. The composition of claim 16, wherein the alloy has a composition defined by the coordinate points A through H of the ternary composition diagram of FIG. 1, where each coordinate point is defined by the atom percents of Fe+M, B and Si and each coordinate point is defined as follows:
A (63, 32, 5)
B (62, 23, 15)
C (63, 15, 22)
D (68, 5, 27)
E (80, 5, 15)
F (77, 7, 16),
G (75, 13, 12), and
H (77, 18, 5).

19. The composition of claim 16 wherein the alloy consists essentially of three elements: iron Fe, boron B, and silicon Si.

20. The composition of claim 19, wherein the alloy has a composition defined by the coordinate points A through H in the ternary composition diagram of FIG. 1, wherein each coordinate point is defined by the atom percentages of Fe, B and Si and where each coordinate point is defined as follows:
A (63, 32, 5)
B (62, 23, 15)
C (63, 15, 22)
D (68, 5, 27)
E (80, 5, 15)
F (77, 7, 16),
G (75, 13, 12), and
H (77, 18, 5).

21. The composition of claim 19 wherein the boron is partially replaced by at least one of phosphorus and carbon.

22. The composition of claim 16 wherein M is chromium Cr and v is a positive number of more than 0.

23. The composition of claim 22 wherein v is a positive number of 2 to 10.

24. The composition of claim 16 wherein M is a mixture of chromium Cr and niobium Nb and v is a positive number of more than 0.

25. The composition of claim 24 wherein about 2 to about 9 atom % of chromium and about 1 to about 8 atom % of niobium are present and v is a positive number of 3 to 10.

26. The composition of claim 16 wherein M is a mixture of chromium Cr and at least one of molybdenum Mo and nickel Ni and v is a positive number of more than 0.

27. The composition of any one of claims 22 to 26 wherein the boron is partially replaced by at least one of phosphorus and carbon.

28. The composition of any one of claims 22 to 26, wherein the alloy has a composition defined by the coordinate points A through H in the ternary composition diagram of FIG. 1, wherein each coordinate point is defined by the atom percentages of Fe+M, B and Si and each coordinate point is defined as follows:
A (63, 32, 5)
B (62, 23, 15)
C (63, 15, 22)
D (68, 5, 27)
E (80, 5, 15)
F (77, 7, 16),
G (75, 13, 12), and
H (77, 18, 5).

29. The composition of claim 16 wherein the powder has a maximum magnetic permeability of at least 20.

30. The composition of claim 16 wherein the powder comprises:
at least 35% by weight of magnetically soft amorphous alloy flakes having a particle size of from 10 to 50 μm,
up to 0.5% by weight of magnetically soft amorphous alloy flakes having a particle size of more than 88 μm, and
up to 10% by weight of magnetically soft amorphous alloy flakes having a particle size of less than 3 μm.

31. The composition of claim 16 which has a maximum magnetic permeability of about 15 to about 70 and a coercive force of from about 5 to about 20 Oe, as measured in a direct current magnetic field.

32. The composition of claim 16 which comprises 65 to 95% by weight of the magnetically soft amorphous alloy particle powder, and the binder is comprised of a urethane polymer.

33. The cured composition of claim 32 wherein the polyurethane binder has been thermoset.

34. The composition of claim 16 wherein the binder is a radiation-curable compound, and the powder and the binder are present in a volume ratio of about 2:8 to about 8:2.

35. The cured composition of claim 34 wherein the radiation-curable compound binder has been cured.

* * * * *